(12) United States Patent
Goel et al.

(10) Patent No.: US 9,625,523 B2
(45) Date of Patent: Apr. 18, 2017

(54) METHOD AND APPARATUS FOR INTERCONNECT TEST

(71) Applicant: Taiwan Semiconductor Manufacturing Co., Ltd., Hsin-Chu (TW)

(72) Inventors: Sandeep Kumar Goel, Dublin, CA (US); Saman M. I. Adham, Kanata, CA (US)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/156,140

(22) Filed: May 16, 2016

(65) Prior Publication Data

US 2016/0259006 A1    Sep. 8, 2016

Related U.S. Application Data

(63) Continuation of application No. 13/864,492, filed on Apr. 17, 2013, now Pat. No. 9,341,672.

(Continued)

(51) Int. Cl.
*G11C 29/00* (2006.01)
*G06F 11/00* (2006.01)
(Continued)

(52) U.S. Cl.
CPC ... *G01R 31/31717* (2013.01); *G01R 31/2856* (2013.01); *G01R 31/3177* (2013.01); *G11C 29/50* (2013.01)

(58) Field of Classification Search
CPC .......... G01R 31/31717; G01R 31/2856; G01R 31/3177; G01R 31/31712; G11C 29/50; G11C 29/5004; G11C 29/08; G11C 29/56
(Continued)

(56) References Cited

U.S. PATENT DOCUMENTS

| 4,970,410 A | * | 11/1990 | Matsushita | ...... | G01R 31/31852 |
| | | | | | 326/47 |
| 5,657,284 A | | 8/1997 | Beffa | | |

(Continued)

OTHER PUBLICATIONS

Marinissen, E.J. et al., "Testing 3D Chips Containing Through-Silicon Vias", ITC 2009 International Test Conference, Nov. 2009, pp. 1-11.

Primary Examiner — Christine Tu
(74) Attorney, Agent, or Firm — Duane Morris LLP

(57) ABSTRACT

A test circuitry for testing an interconnection between interconnected dies includes a cell embedded within one of the dies. The cell includes a selection logic module that includes a first multiplexer configured to receive a first control signal and provide a first output test signal, and a second multiplexer configured to receive a second control signal and provide a second output test signal. The cell includes a scannable data storage module coupled to the first multiplexer; and a transition generation module configured to receive a third control signal; wherein the first and second output test signals are generated based on respective states of the first, second, and third control signals, and wherein the test circuitry is configured to use the first and second output test signals to perform at least two of: a DC test on the interconnection, an AC test on the interconnection, and a burn-in-test on the interconnection.

20 Claims, 19 Drawing Sheets

Related U.S. Application Data

(60) Provisional application No. 61/777,152, filed on Mar. 12, 2013.

(51) Int. Cl.
*G01R 31/317* (2006.01)
*G11C 29/50* (2006.01)
*G01R 31/28* (2006.01)
*G01R 31/3177* (2006.01)

(58) Field of Classification Search
USPC ......... 714/18, 721, 725, 733, 734, 736, 742;
365/201, 185.24, 185.18, 185.01, 185.26,
365/189.09, 201.15; 324/522, 523, 527,
324/750, 763, 765, 549
See application file for complete search history.

(56) References Cited

U.S. PATENT DOCUMENTS

| | | |
|---|---|---|
| 5,956,279 A | 9/1999 | Mo et al. |
| 6,105,152 A | 8/2000 | Duesman et al. |
| 7,956,661 B2* | 6/2011 | Machida .............. H03K 3/0375 |
| | | 327/199 |
| 8,446,772 B2 | 5/2013 | Tu et al. |
| 2012/0221906 A1* | 8/2012 | Shetty .............. G01R 31/31855 |
| | | 714/727 |

* cited by examiner

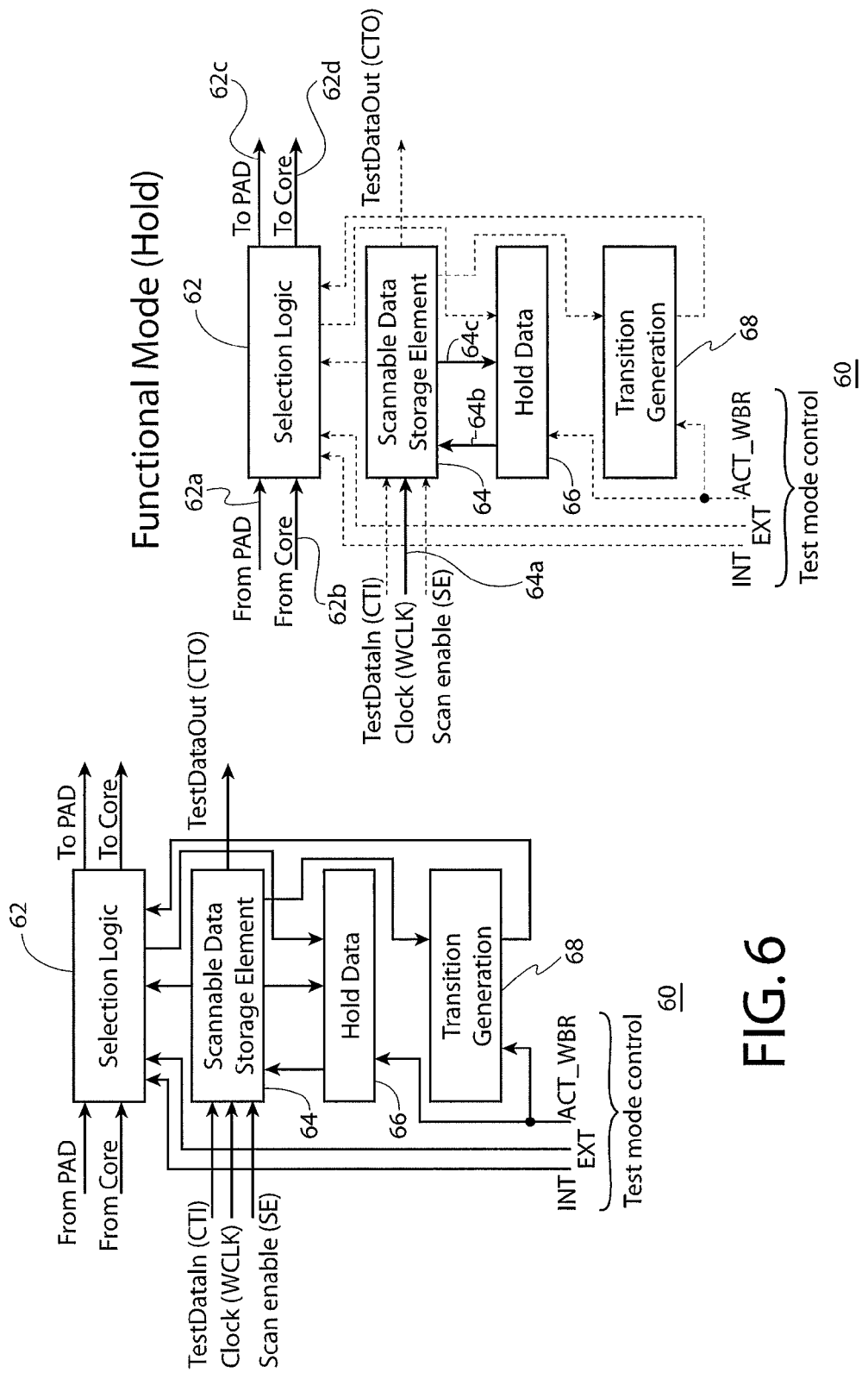

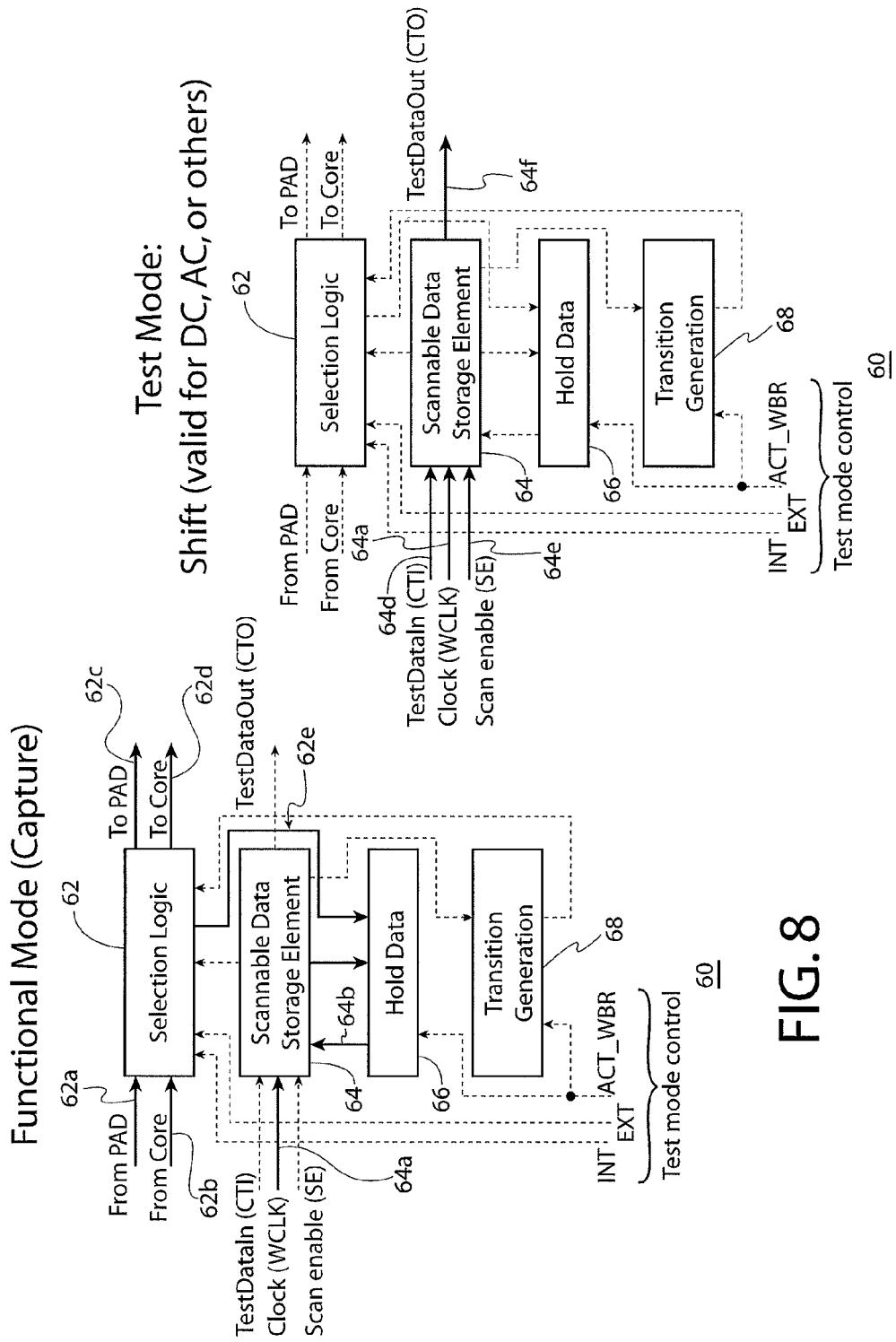

METHOD AND APPARATUS FOR INTERCONNECT TEST

CROSS-REFERENCE TO RELATED APPLICATIONS

This application is a continuation of U.S. patent application Ser. No. 13/864,492, filed Apr. 17, 2013, now is a U.S. Pat. No. 9,341,672, which is incorporated by reference herein in its entirety.

BACKGROUND

The semiconductor industry is on an ongoing quest to integrate more functionality into a smaller form factor with increased performance, lower power and reduced cost. Traditionally, only two-dimensional planes were used for these smaller form factors: through conventional CMOS scaling, multiple IP cores in a single die (System-on-Chip, SoC), multiple dies in a single package (Multi-Chip Package, MCP) and multiple ICs on a printed Circuit Board (PCB). More recently, also the third, vertical dimension started to become exploited: System-in-Package (SiP), in which multiple naked dies are vertically stacked in a single IC package, and interconnected by means of wire-bonds to the substrate; and Package-on-Package (PoP), in which multiple packaged chips are vertically stacked.

Three-dimensional (3D) stacking of chips promises higher transistor densities and smaller footprints of electronic products. The latest evolution in this list of innovations is the so-called three-dimensional stacked IC (3D-SIC); a single package containing a vertical stack of naked dies which are interconnected by means of inter-die interconnections, optionally including through-substrate-vias (TSVs).

Semiconductor manufacturing processes are defect-prone and hence all ICs need to be tested for manufacturing defects. Stacked ICs are no exception to this. Hence these new inter-die connected 3D-SICs need to be tested for manufacturing defects, in order to guarantee sufficient outgoing product quality to a customer. Chip stacks should be delivered fault free as much as possible. In 3D chip stacking, the inter-die interconnections carry all interconnect signals between two dies, and hence are quite critical for functional operation of the chip. Both the inter-die interconnection manufacturing process, as well as the bonding process are delicate, and hence the inter-die interconnects are prone to defects, such as for example opens, shorts, delay defects, or resistance issues.

Common static fault models for interconnects are hard opens and shorts. They can be tested with a static (DC) test using wrappers. Dedicated test pattern generation tools are available for generating the appropriate test patterns. However, inter-die interconnects can also exhibit other defects which are problematic and are not covered by existing designed-for-testing or DfT solutions.

BRIEF DESCRIPTION OF THE DRAWINGS

The present disclosure is best understood from the following detailed description when read in conjunction with the accompanying drawings. It is emphasized that, according to common practice, the various features of the drawings are not necessarily to scale. On the contrary, the dimensions of the various features can be arbitrarily expanded or reduced for clarity. Like numerals denote like features throughout the specification and drawing.

FIG. 6 is a block diagram of a wrapper cell in accordance with one embodiment.

FIG. 7 is the block diagram of the wrapper cell of FIG. 6 illustrating a hold functional mode.

FIG. 8 is the block diagram of the wrapper cell of FIG. 6 illustrating a capture functional mode.

FIG. 9 is the block diagram of the wrapper cell of FIG. 6 illustrating a shift functional mode.

Figure 1:
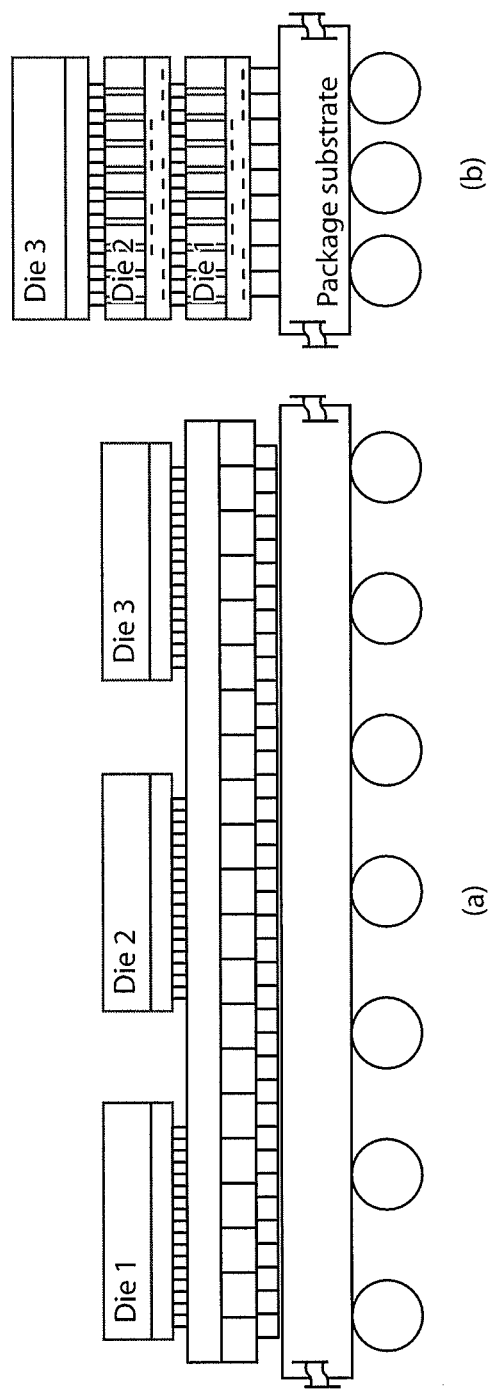
FIG. 1(a) illustrates an interposer-based 3D SIC and FIG. 1(b) illustrates a 3D SIC.

The drawings are only schematic and are non-limiting. In the drawings, the size of some of the elements may be exaggerated and not drawn on scale for illustrative purposes. The dimensions and the relative dimensions do not necessarily correspond to actual reductions to practice of the disclosure.

Any reference signs in the claims shall not be construed as limiting the scope. In the different drawings, the same reference signs refer to the same or analogous elements.

DETAILED DESCRIPTION

The present disclosure will be described with respect to particular embodiments and with reference to certain drawings but the disclosure is not limited thereto but only by the claims.

It should be understood that the proceeding examples are intended to be exemplary only and other cleaning apparatus, methods, and chemical compositions can be used in other exemplary embodiments and further components can also be included in the various embodiments.

The terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments described herein are capable of operation in other orientations than described or illustrated herein.

It is to be noticed that the term "comprising", used in the claims, should not be interpreted as being restricted to the means listed thereafter; and it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present disclosure, the only relevant components of the device are A and B.

Reference throughout this specification to "one embodiment" or "an embodiment" means that a particular feature, structure or characteristic described in connection with the embodiment is included in at least one embodiment of the present disclosure. Thus, appearances of the phrases "in one embodiment" or "in an embodiment" in various places throughout this specification are not necessarily all referring to the same embodiment, but may apply or refer to different embodiments. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments, various features are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed disclosure requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this disclosure.

Furthermore, while some embodiments described herein include some but not other features included in other embodiments, combinations of features of different embodiments are meant to be within the scope of the disclosure, and form different embodiments, as would be understood by those of ordinary skill in the art. For example, in the following claims, any of the claimed embodiments can be used in any combination.

It should be noted that the use of particular terminology when describing certain features or aspects of the disclosure should not be taken to imply that the terminology is being re-defined herein to be restricted to include any specific characteristics of the features or aspects of the disclosure with which that terminology is associated.

In the context of the present disclosure, delay defects are defects where signals are transferred, but not within specified delay time margins. A transition delay defect is a defect where a transition signal (e.g. transition from high to low, such as logical 1 to logical 0, or a transition from low to high, such as logical 0 to logical 1) is delayed more than specified delay margins. A rise transition defect is the same as a transition delay defect for a transition from low to high. A fall delay defect is a transition delay defect for a transition from high to low.

In the description provided herein, numerous specific details are set forth. However, it is understood that embodiments of the disclosure may be practiced without these specific details. In other instances, well-known methods, structures and techniques have not been shown in detail in order not to obscure an understanding of this description.

A 3D die stack comprises two or more chips (integrated circuits) stacked vertically so that they occupy less space and/or have a larger connectivity, as for example illustrated in FIG. 1(b). In particular stacks, an interposer may be used as an electrical interface between die towers (in FIG. 1(a)) each tower comprising at least one die where the interposer electrically interconnects the die towers by means of at least functional wires in the interposer. An example of such stack is illustrated in FIG. 1(a). In the context of the present disclosure, a functional wire is a wire, e.g. a metal interconnect, which is part of the functional design of stack, and which is not dedicatedly added for test purposes. In the context of the present disclosure, a test access mechanism (TAM) provides the means for on-chip test data transport. Test wrappers form an interface between a die and its environment, and connect the terminals of the die to other dies and to the TAM.

Figure 2:
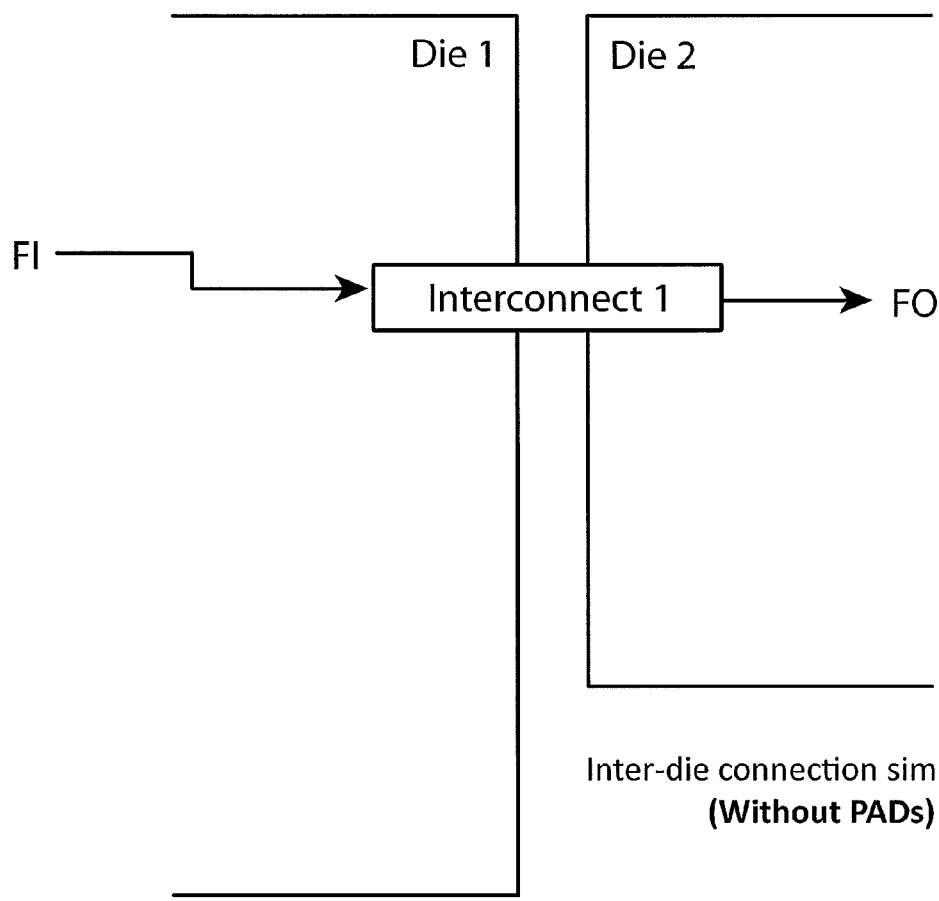
FIG. 2 schematically illustrates two stacked and interconnected dies shown without pads.

Embodiments of the present disclosure relate to a system and method for testing delay defects in inter-die interconnects, for example, but not limited thereto, in a 3D chip stack. FIG. 2 illustrates (part of) such 3D chip stack, comprising at least a first die Die 1, for example a bottom die, and a second die Die 2, for example a top die, connected to one another by means of a functional wire interconnect 1, which is an inter-die interconnect (interconnection between circuitry—not illustrated—on two different dies). The pads of the respective dies are not shown for simplicity.

Figure 3:
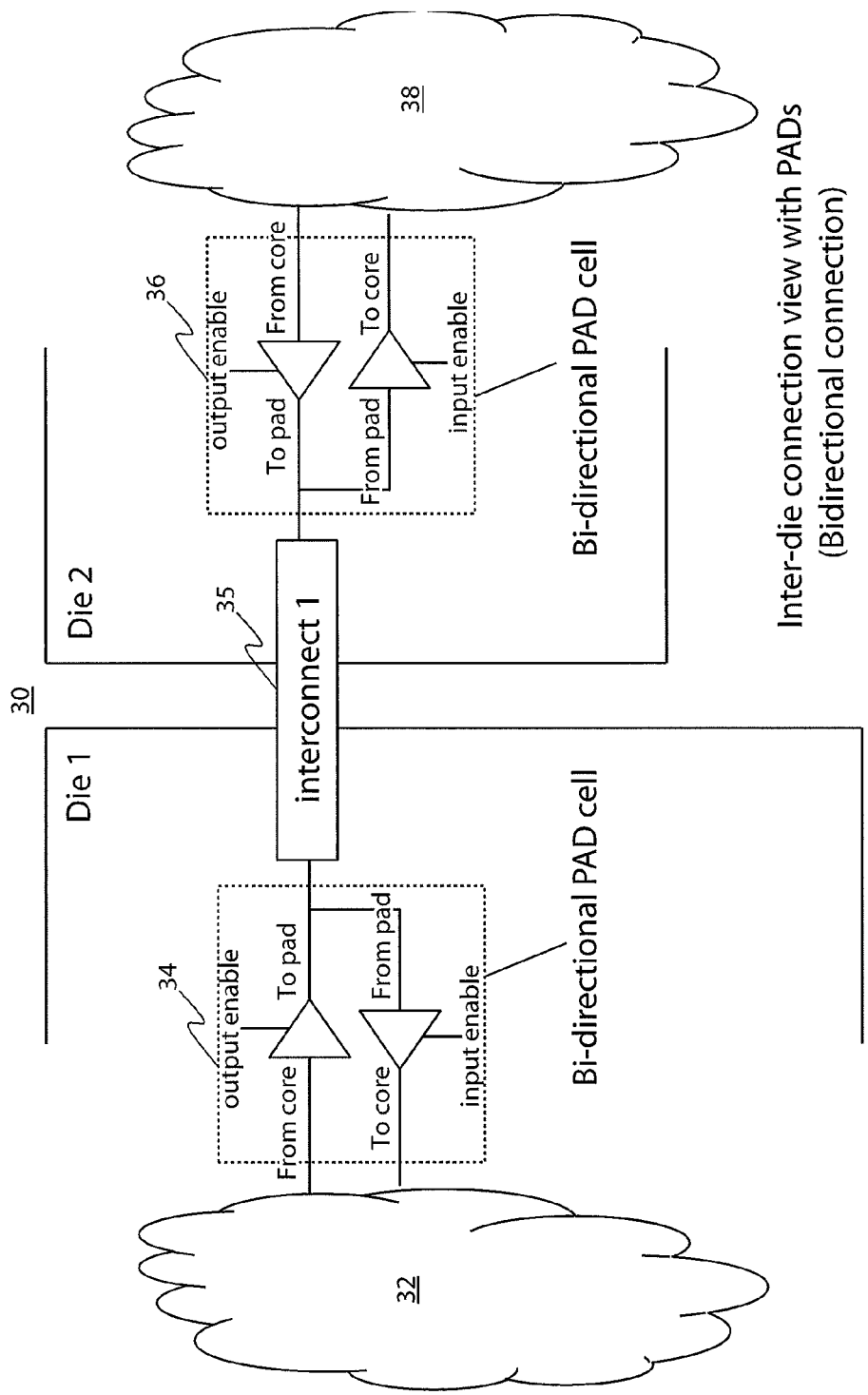
FIG. 3 schematically illustrates two stacked and interconnected dies shown with pads in the form of bi-directional pads.

FIG. 3 is a system or structure 30 depicting two interconnected dies. A first die or Die 1 includes integrated circuitry in a core 32 which includes logic or memory for example. In one configuration, the core 32 is coupled to a bi-directional pad cell 34. The pad cell 34 couples to the second die or die 2 via an inter-die interconnect 35. Die 2 includes integrated circuitry in a core 38 which includes logic or memory circuitry for example. The interconnect 35 couples to the core 38 via a bi directional pad cell 36. Thus, the two interconnected dies can represent inter-die interconnects of logic-to-logic, logic-to-memory, or memory to memory for example. Testing of inter-die interconnects can help find stacking process weaknesses and reduce test costs related to stacking of good dies in a bad stack.

Figure 4:
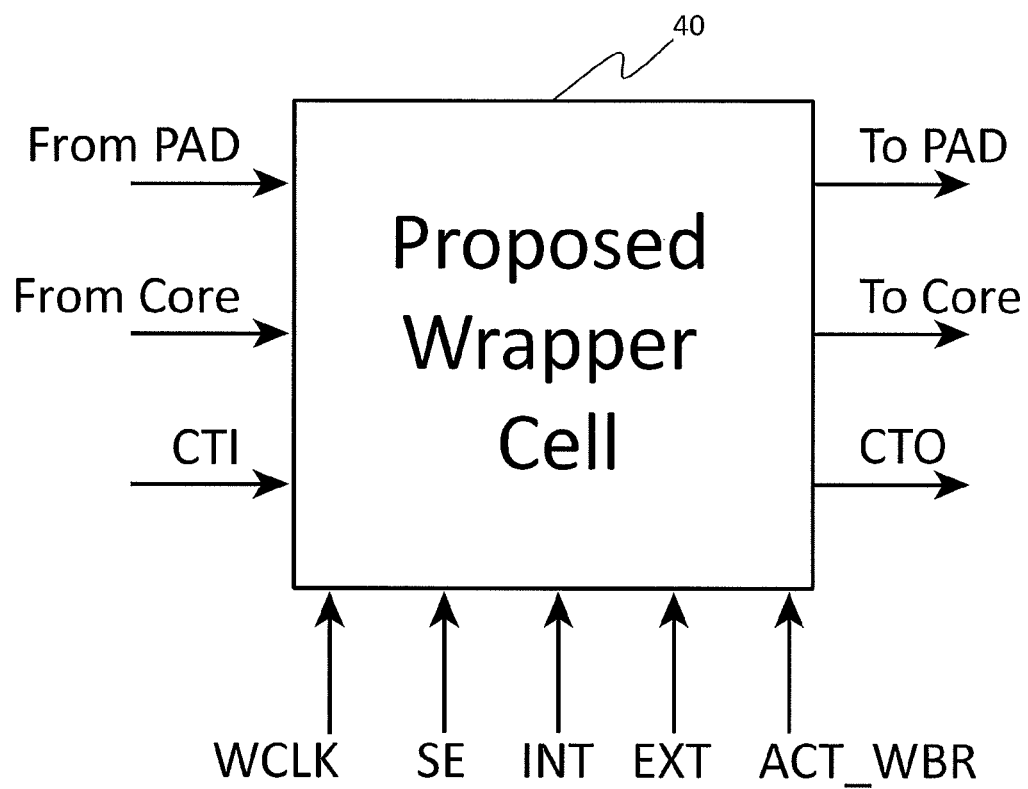
FIG. 4 illustrates a wrapper cell according to the embodiments herein.

Referring to FIG. 4, a high level view of a wrapper cell 40 in accordance with some embodiments of the present disclosure illustrates a number of inputs and outputs. The inputs and outputs will generally be viewed consistently in the other representative figures. The inputs include an input from the pad ("From PAD"), from the core (integrated circuitry on the die) ("From Core"), and a test data input ("CTI") which can be an input for test data that may come from another wrapper cell or other chip/die-level pin. Other inputs include a wrapper clock (WCLK) input, a scan enable (or Shift Enable) (SE) input, an internal test mode (INT) input, external test mode (EXT) input, and an AC Test-wrapper boundary register (ACT_WBR) input. The outputs can include an output to the pad ("To PAD"), an output to the core ("To Core"), and a test data output ("CTO") which can be an output for test data that goes to another wrapper cell.

Figure 5:
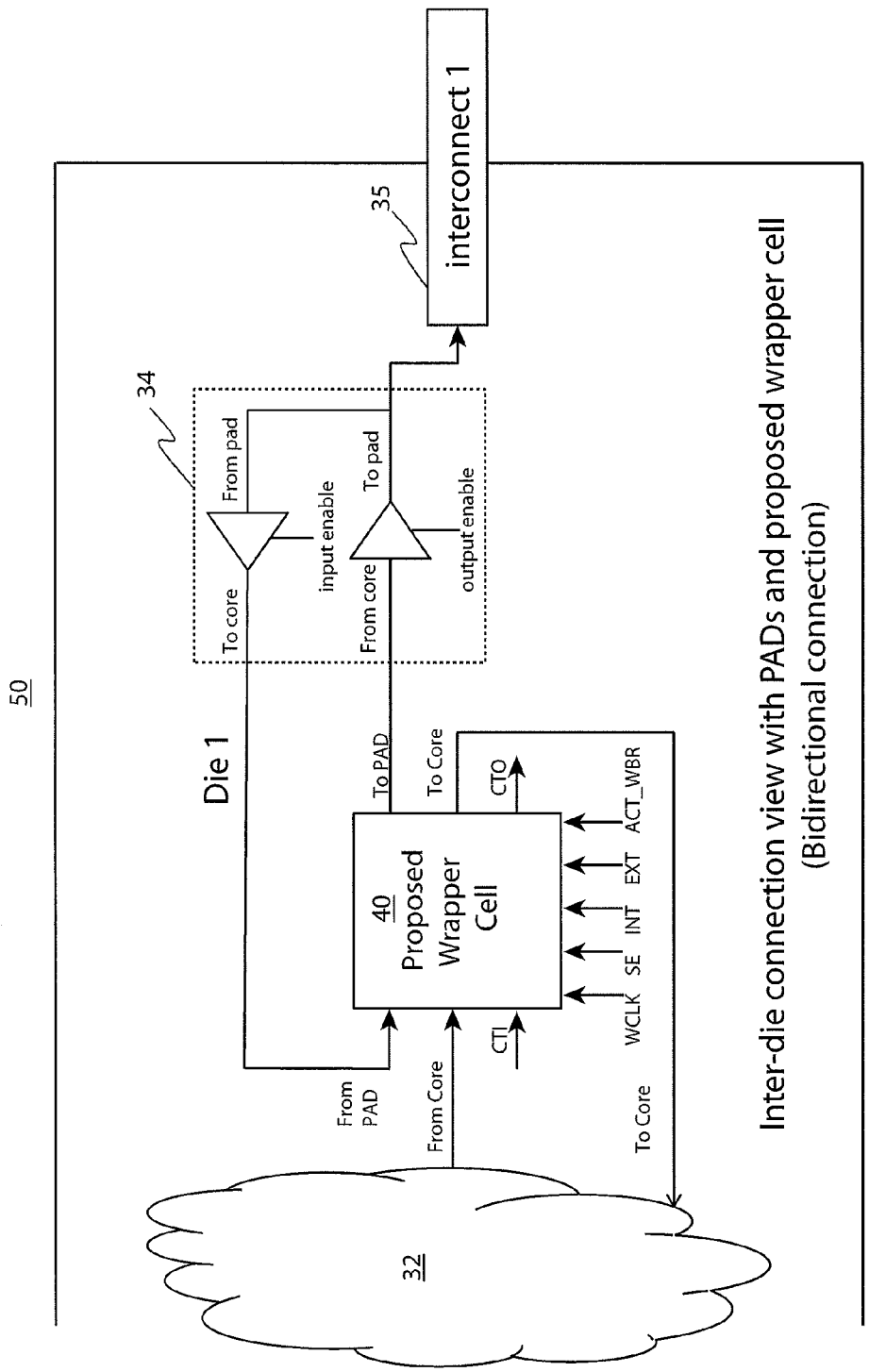
FIG. 5 illustrate the wrapper cell of FIG. 4 embedded in a die between an integrated circuit core and a pad according to one embodiment.

Referring to FIG. 5, the wrapper cell 40 is shown within a structure or system 50 that includes the wrapper cell 40 coupled between an integrated circuit core 32 and a bi-directional pad cell 34. The pad cell 34 is coupled to an inter-die interconnect 35 which enables one die (Die 1) to connect to another die (not shown here, but see Die 2 of FIGS. 2 and 3, for example). The design of the system 50 provides a standardized wrapper cell for DC (open and short defects test), AC (resistive defects test) or Burn-in-test. The wrapper cell 40 supports DC, AC and Burn-in test of interconnects and can minimize the use of external tester or automatic test equipment (ATE) pins for burn-in test data. Furthermore, the wrapper cell 40 provides a combination of functions not previously available from prior wrapper cell configurations providing for any combination of DC, AC, and burn-in tests. For example, the pins toggle autonomously during burn-in mode and the pins generate transitions autonomously during AC tests. The wrapper cell 40 can be applicable to 3D stacking (see FIGS. 1(b) and 2.5D (see FIG. 1(a)) stacking as well as all other system integration approaches. Further note that the pads do not have to be bi-directional in one or more of the embodiments herein. The pads can be input only or output only pads and still apply to the methods and devices herein.

The system 50 and wrapper cell 40 can provide for a standardized and modular solution which can also be an IEEE 1500-based Die-level/3D stacking solution. Such configuration can allow for full tool support and be fully compliant with high bandwidth memory (HBM) and IEEE P1838 standards. As with many other standards, the wrapper cell 40 fully supports DC tests, but further enables and supports AC and burn-in tests.

Most existing configurations allow for a DC test that checks for open or short defects. Unfortunately, existing design for test (or DfT) configurations fail to provide for other tests used for testing inter-die interconnections such as the AC test that checks for resistive defects or the burn-in test that checks for reliability failures. The disclosed system 50 provides a wrapper cell that includes an efficient AC test without necessarily adding too much additional logic or complexity. The burn-in test mode of this configuration enables the high toggling of a chip at elevated temperature and voltage which again is not available in existing DfT solutions. The system 50 uses the wrapper cell 40 to wrap each input/output (I/O) to allow the launch of test stimuli and capture of test response.

In comparison to many existing wrapper cell solutions, existing solutions fail to provide for plug-n-play stacking, self-aware logic die that generate control signals, mechanisms for launching transitions used for AC test, or mechanisms for toggling pins used for burn-in test. In general, existing solutions only support DC interconnect test.

Referring to FIG. 6, a high level view of a wrapper cell 60 includes selection logic 62, a scannable data storage element 64, a hold data module 66, and a transition generation module 68. The inputs and outputs of the wrapper cell 40 of FIGS. 4 and 5 correspond to the inputs and outputs shown in FIG. 6 as well as FIGS. 7-20. FIGS. 6-11 illustrate a high-level view in various modes where the active lines are shown in bold. FIGS. 12-20 illustrate corresponding circuit diagrams in various operational modes.

Referring to FIG. 7, the wrapper cell 60 is shown in a functional hold mode where the wrapper clock signal WCLK 64a is active and signaling between the scannable data storage element 64 and the hold data module 66 is active with signals 64b and 64c. In this mode, the data stored in the storage element 64 does not change. The input signals "From Pad" 62a and "From Core" 62b and the output signals "To PAD" 62c and "To Core" 62d to and from the selection logic 62 are also active. Referring to FIG. 8, the functional capture mode is similar to the hold function of FIG. 7, but has an active signal 62e going from the selection logic 62 to the hold data module 66. In this mode, a new data available on the "To Core" signal is captured in the storage element 64. Referring to FIG. 9, in a test mode, the shift function (for the AC, DC and other tests) has active input signals for test data in (CTI) 64d, scan enable (SE) 64e, and for the wrapper clock (WCLK) 64. The test data out (CTO) signal 64f is also active at the output of the scannable data storage element 64.

Figures 10, 11:
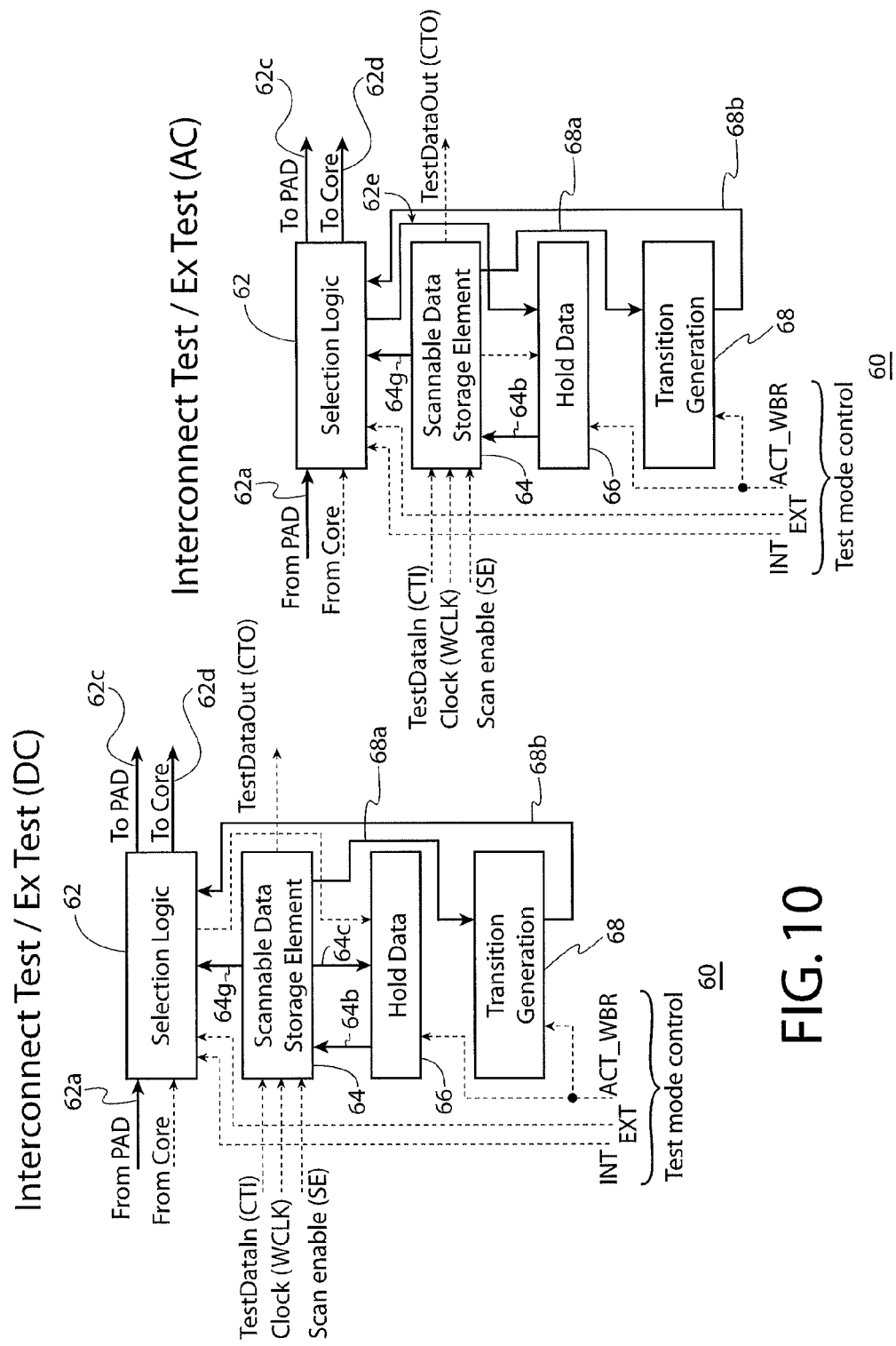
FIG. 10 is the block diagram of the wrapper cell of FIG. 6 illustrating an external DC test functional mode.
FIG. 11 is the block diagram of the wrapper cell of FIG. 6 illustrating an external AC functional mode.

Referring to FIG. 10, the wrapper cell 60 during an interconnect test in an external test for DC (shorts or open defects), the selection logic 62 has active inputs "From PAD" 62a, from the scannable data storage element 64 (64g), and from the transition generation module 68 (68b) and outputs "To PAD" 62c and "To Core" 62d. The scannable data storage element 64 has an active input 64b from the hold data module 66 and active outputs to the selection logic 62 (64g), the hold data module 66 (64c), and the transition generation module 68 (68a). The transition generation module 68 has an input from the scannable data storage element 64 (68a as noted above) and an output 68b to the selection logic 62.

Referring to FIG. 11, the wrapper cell 60 during an interconnect test in an external test for AC (resistive defects), the selection logic 62 has active inputs "From PAD" 62a, from the scannable data storage element 64 (64g), and from the transition generation module 68 (68b) and outputs "To PAD" 62c and "To Core" 62d and an output 62e to the hold data module 66. The scannable data storage element 64 has an active input 64b from the hold data module 66 and active outputs (64g) to the selection logic 62, and the transition generation module 68 (68a). The transition generation module 68 has an input (68a) from the scannable data storage element 64 and an output 68b to the selection logic 62.

Figure 12:
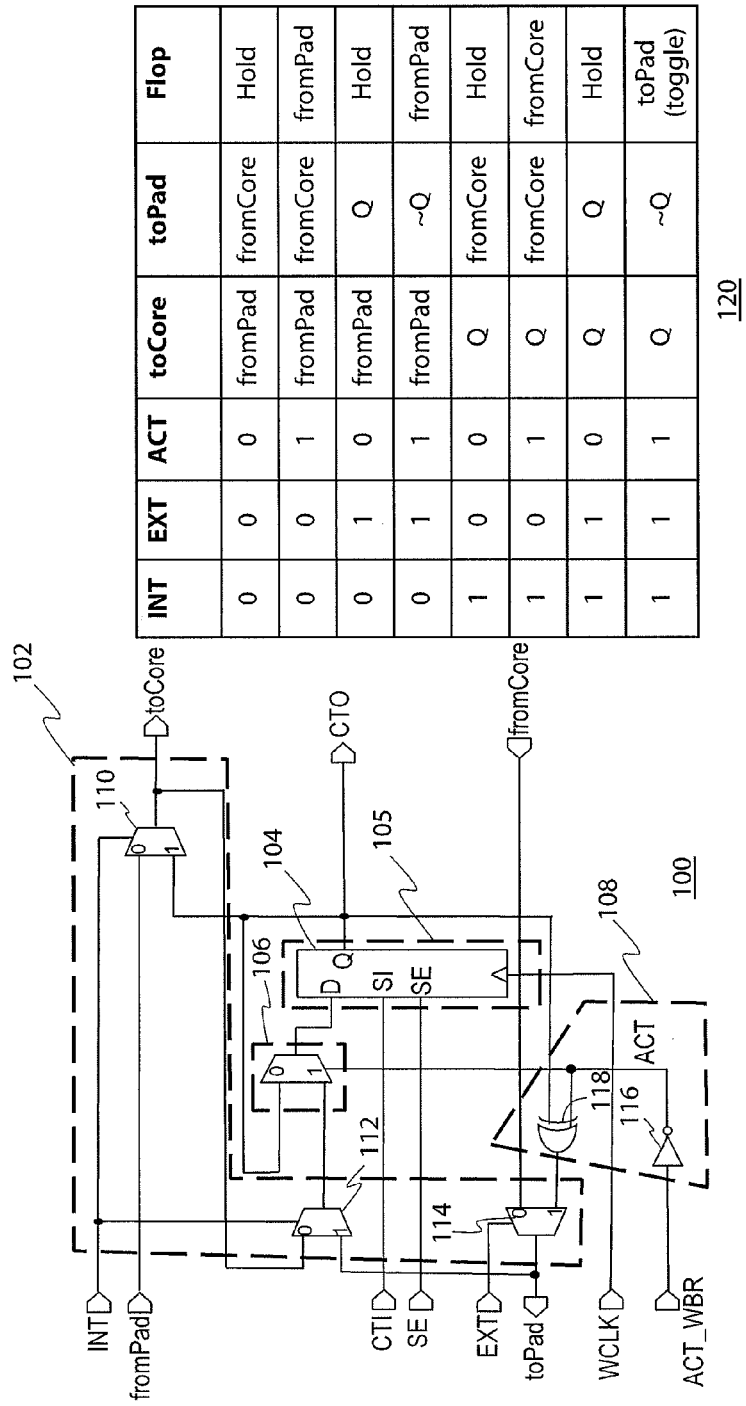
FIG. 12 illustrates an embodiment of a test circuitry in accordance to the present disclosure corresponding to the wrapper cell of FIG. 4 or FIG. 6 and further illustrating a function chart.

Referring to FIG. 12, a diagram of a circuit 100 illustrates a functional equivalent of the wrapper cell 60 of FIGS. 6-11. A corresponding function table 120 for the circuit 100 for hold and capture functionality is shown. The circuit 100 includes all the same inputs and outputs described and shown in FIGS. 6-11. Furthermore, the circuit 100 includes selection logic 102 which is a circuit equivalent of the selection logic of 62 of wrapper cell 60. The selection logic 102 in this embodiment can include multiplexers 110, 112, and 114. The circuit 100 includes scannable data storage element 105 which includes the flip flop 104 which is the circuit equivalent of the scannable data storage element 64 of wrapper cell 60. The hold data module 106 in this embodiment comprises a single multiplexer which can be the circuit equivalent of the hold data module 66 of wrapper cell 60. Although not shown, the hold module 106 is coupled with the input and output of the storage element 105. The transition generation element 108 is the circuit equivalent of transition generation element 68 of wrapper cell 60. The transition generation element 108 can include a inverter 116 and an exclusive-OR gate 118. In an alternative embodiment, the inverter can be replaced with an XOR gate only and the signal can be generated with inverse polarity. Details of function table 120 are further described below.

Figure 13:
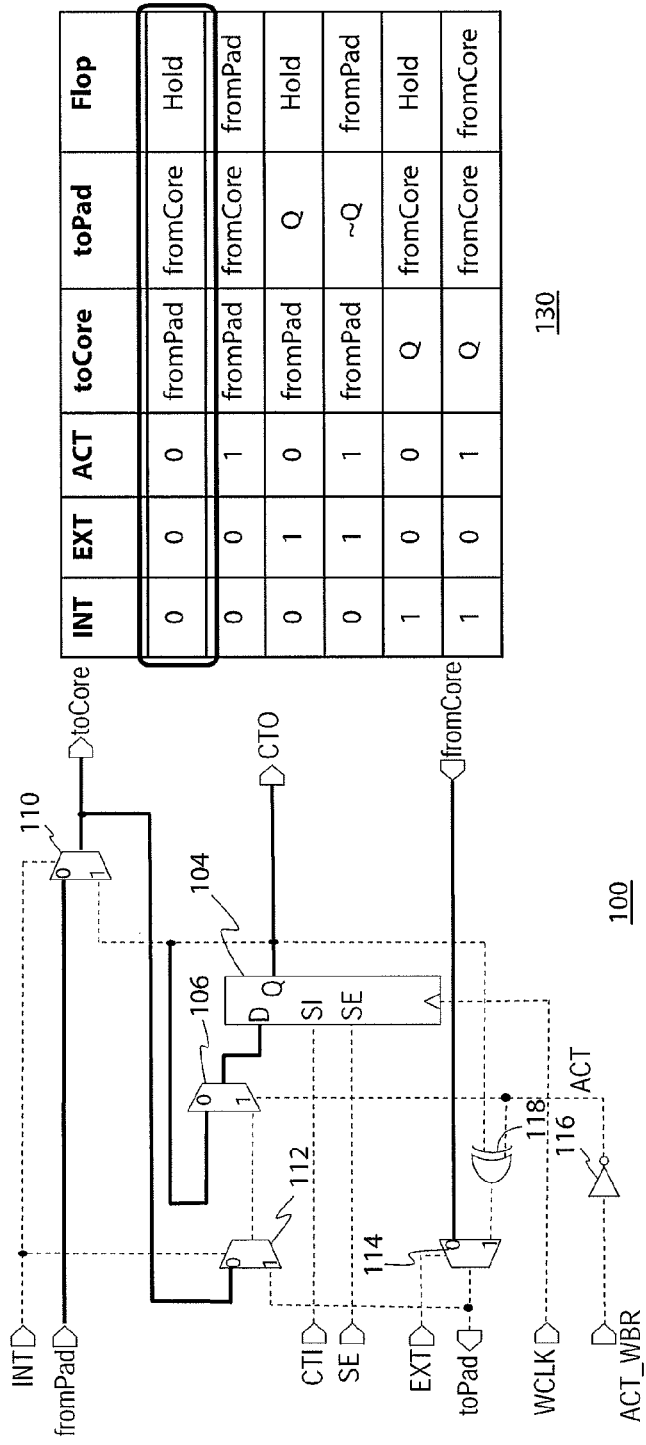
FIG. 13 illustrates the test circuitry of FIG. 12 in a hold functional mode in accordance with the embodiments.

Referring to FIG. 13, a functional hold mode has test control inputs INT, EXT, and ACT equal to zero (0). The active signal lines in the circuit 100 are highlighted or in bold and also reflected in the function chart 130. The signal from "From PAD" to "To Core" through multiplexer 110 of the selection logic is active. Additionally, the signal from "From Core" to "To PAD" through multiplexer 114 of the selection logic is also active. The flip flop 104 is shown in a hold mode having active signaling between the multiplexer 106 (the hold data module) and the flip flop 104 (the scannable data storage element). During the hold mode, data available at the storage element (105) output Q is fed back to its input through the hold data module 106.

Figure 14:
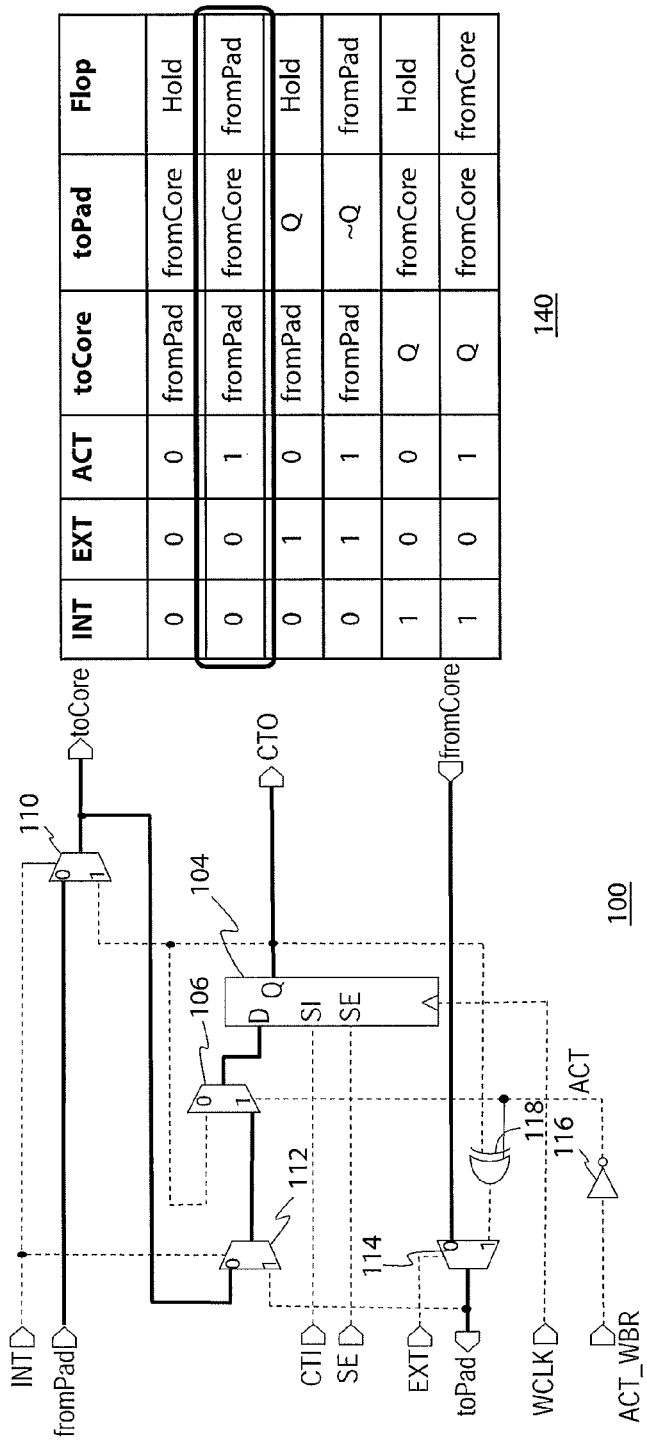
FIG. 14 illustrates the test circuitry of FIG. 12 in a capture functional mode in accordance with the embodiments.

Referring to FIG. 14, a functional capture mode has test control inputs INT, EXT equal to zero (0), and ACT equal to one (1). The active signal lines in the circuit 100 are highlighted or in bold and also reflected in the function chart 140. The signal from "From PAD" to "To Core" through multiplexer 110 of the selection logic is active. Additionally, the signal from "From Core" to "To PAD" through multiplexer 114 of the selection logic is also active. The flip flop 104 is shown in a capture mode having active signaling between "From PAD" and the Flip Flop 104 which includes active signaling between the multiplexer 106 (the hold data module) and the flip flop 104 (the scannable data storage element). During capture mode, data available at the "To_Core" port is captured in the storage element 105 through the selection logic 102 and the second input of the hold data module 106.

Figure 15:
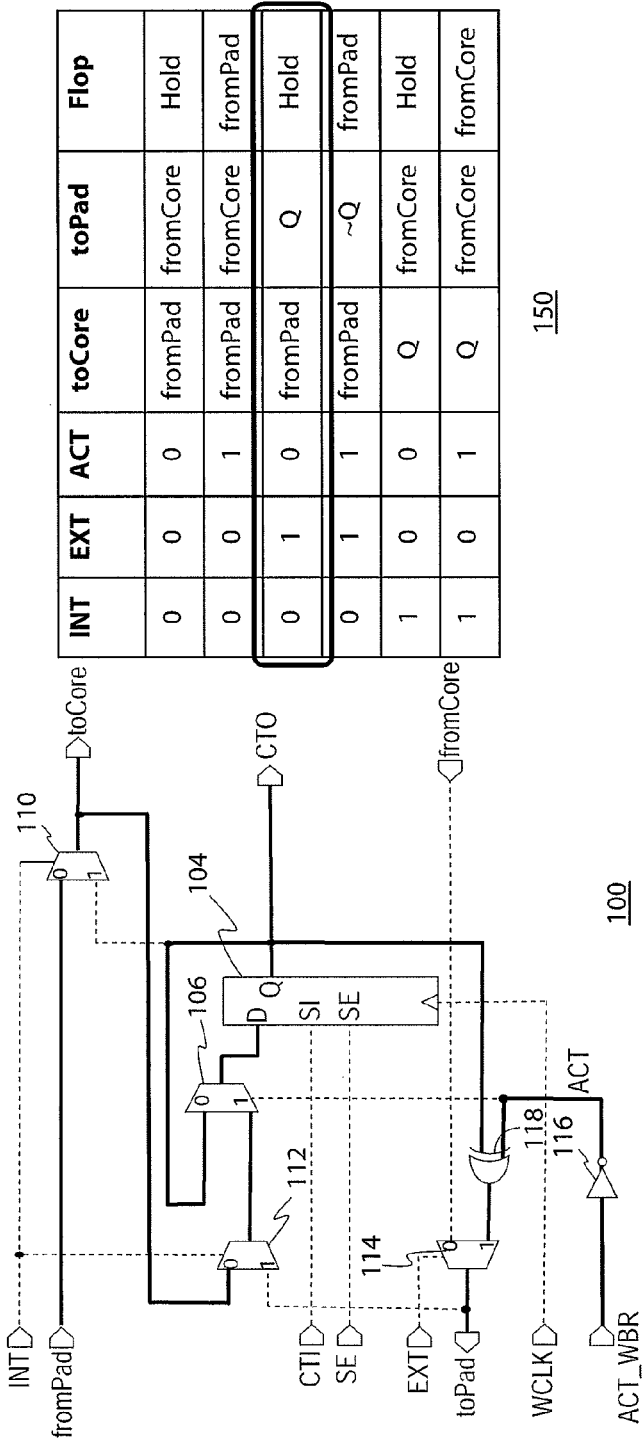
FIG. 15 illustrates the test circuitry of FIG. 12 in an external hold (for DC test) test mode in accordance with the embodiments.

Referring to FIG. 15, an interconnect test in an external test mode for a hold/DC test is shown. Note that the DC Test Mode uses the hold mode as part of the DC test, but the hold mode can be used for other test purposes as well. With these various modes, logic and circuitry outside the wrapped chip or die can be tested as part of an "external" or "extest" mode. This mode has test control inputs of INT=0, EXT=1, and ACT=0. The active signal lines in the circuit 100 are highlighted or in bold and also reflected in the function chart 150. The signal from "From PAD" to "To Core" through multiplexer 110 of the selection logic is active. Signaling is active from the scannable data storage element (from output Q of flip flop 104) to hold data module (multiplexer 106) and from output of the multiplexer 106 (hold data module) to the flip flop 104. Additionally, the flip flop 104 is shown in a hold mode having active signaling from the Flip Flop 104 to the transition generation module (at the exclusive OR gate 118). The signaling is also active from the transition generation module from the exclusive OR gate 118 to the selection logic at multiplexer 114. Note that the ACT signal is an inverted signal of the ACT_WBR input signal. Further note that the "toPad" signal is the same as the Q of 104.

Figure 16:
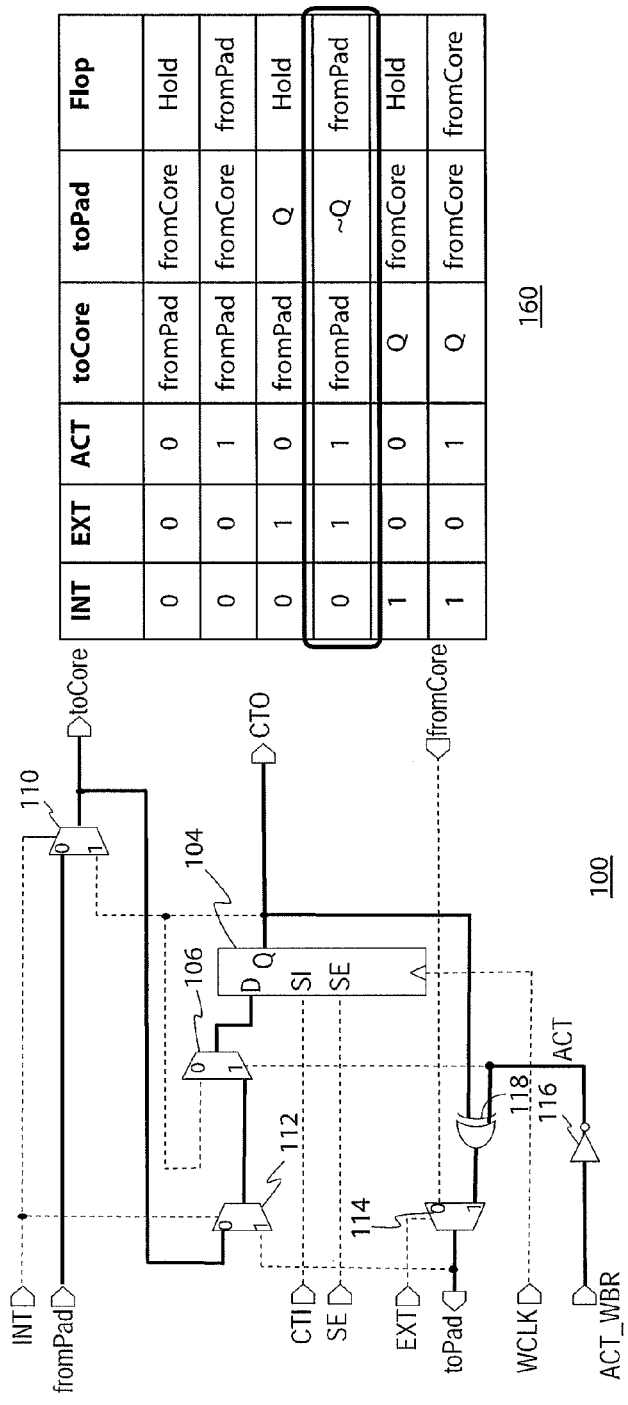
FIG. 16 illustrates the test circuitry of FIG. 12 in an external transition (for AC test) test mode in accordance with the embodiments.

Referring to FIG. 16, an interconnect test in an external test mode for a transition/AC test is shown. This mode has test control inputs of INT=0, EXT=1, and ACT=1. The active signal lines in the circuit 100 are highlighted or in bold and also reflected in the function chart 160. The signal from "From PAD" to "To Core" through multiplexer 110 of the selection logic is active. Signaling is active from the multiplexer 106 (hold data module) to the flip flop 104. Additionally, the flip flop 104 is shown in a transition/AC test mode having active signaling that toggles from the Q output to the Pad through the exclusive OR gate 118 of the transition generation module and through multiplexer 114 of the selection logic. The signal from the Pad to the Flip Flop 104 is also active via the multiplexers 110 and 112 of the selection logic and via multiplexer 106 of hold data module (in this mode the toPad is the inversion of the Q of 104).

Figure 17:
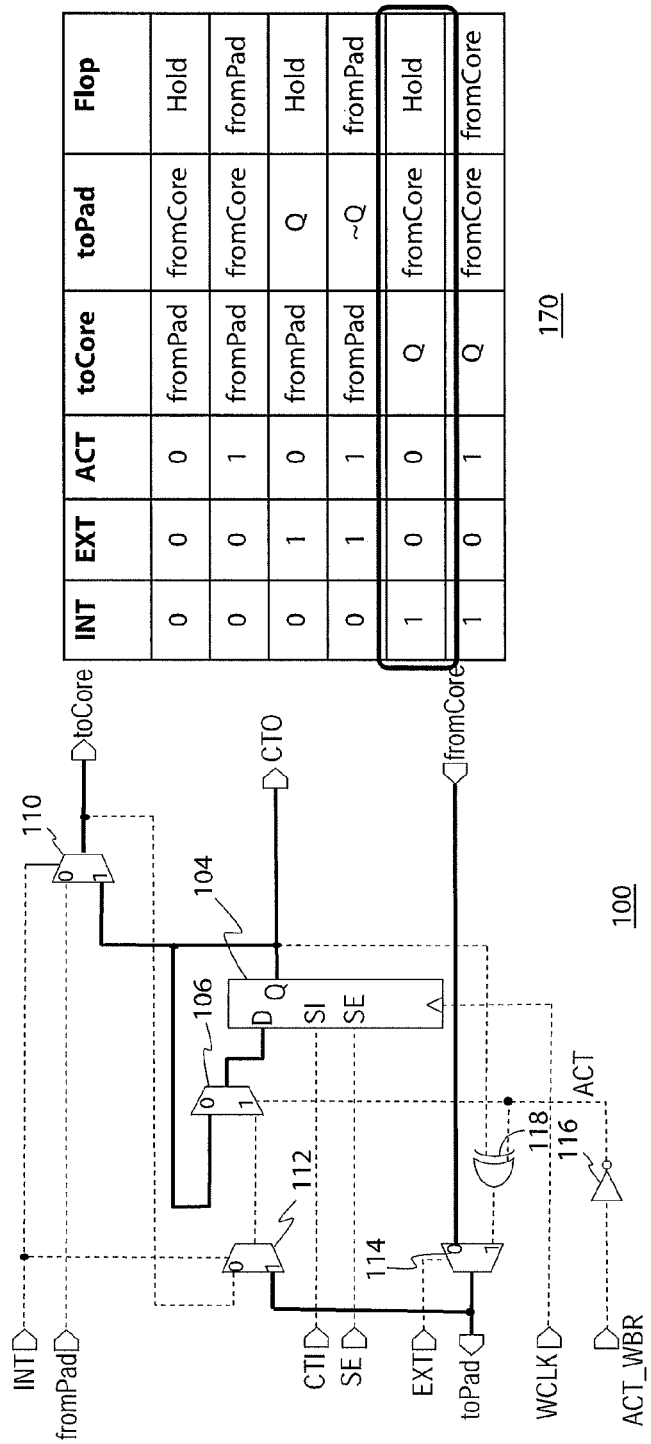
FIG. 17 illustrates the test circuitry of FIG. 12 in an internal (for hold) test mode in accordance with the embodiments.

Referring to FIG. 17, a core or IP test or internal test in a hold mode is shown. This mode has test control inputs of INT=1, EXT=0, and ACT=0. The active signal lines in the circuit 100 are highlighted or in bold and also reflected in the function chart 170. The signal "To Core" comes from the Q output of the scannable data storage element or flip flop 104. The signal to the pad from the core is active via multiplexer 114 of the selection logic. The signaling to and from the multiplexer 106 of the hold data module and the flip flop 104 is similar to the hold pattern of FIG. 13 where output of the flip flop 104 is fed back to the hold data module or multiplexer 106.

Figure 18:
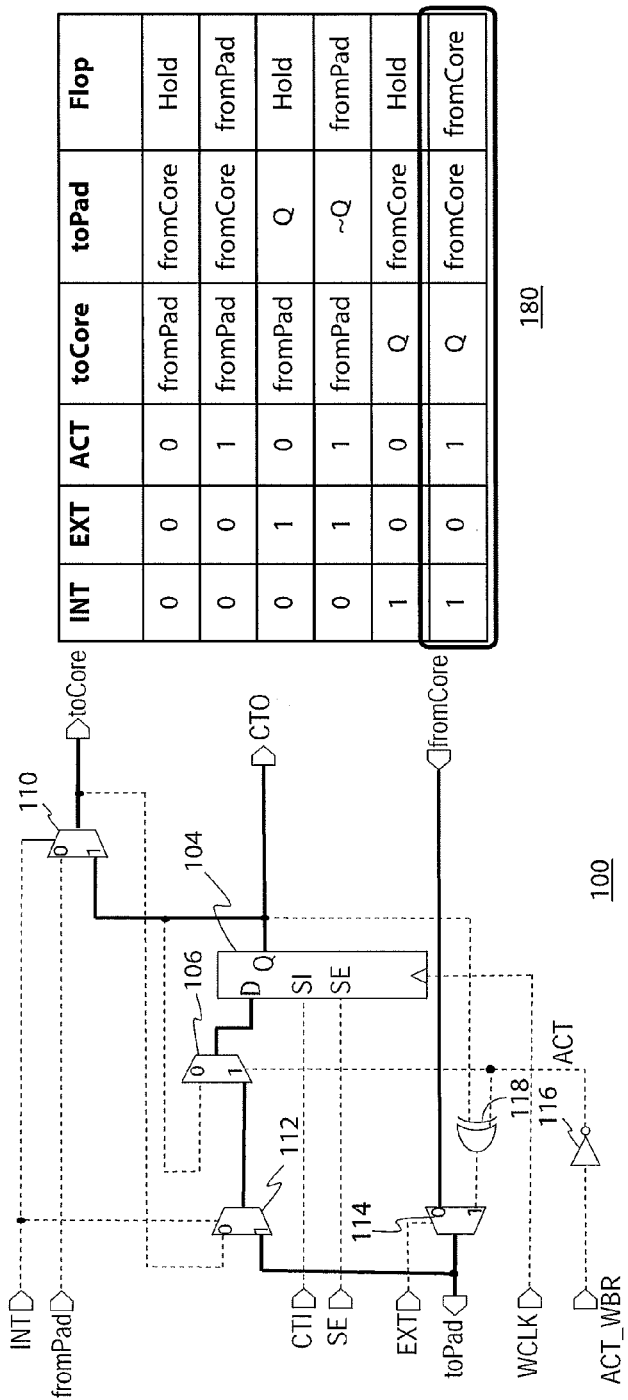
FIG. 18 illustrates the test circuitry of FIG. 12 in an internal (for capture) test mode in accordance with the embodiments.

Referring to FIG. 18, a core or IP test or internal test in a capture mode is shown. This mode has test control inputs of INT=1, EXT=0, and ACT=1. The active signal lines in the circuit 100 are highlighted or in bold and also reflected in the function chart 180. The signal "To Core" comes from the Q output of the scannable data storage element or flip flop 104. The signal to the pad from the core is active via multiplexer 114 of the selection logic. The signaling to the flip flop 104 from the core goes through the multiplexers 114 and 114 of the selection logic and through multiplexer 106 of the hold data module.

Figure 19:
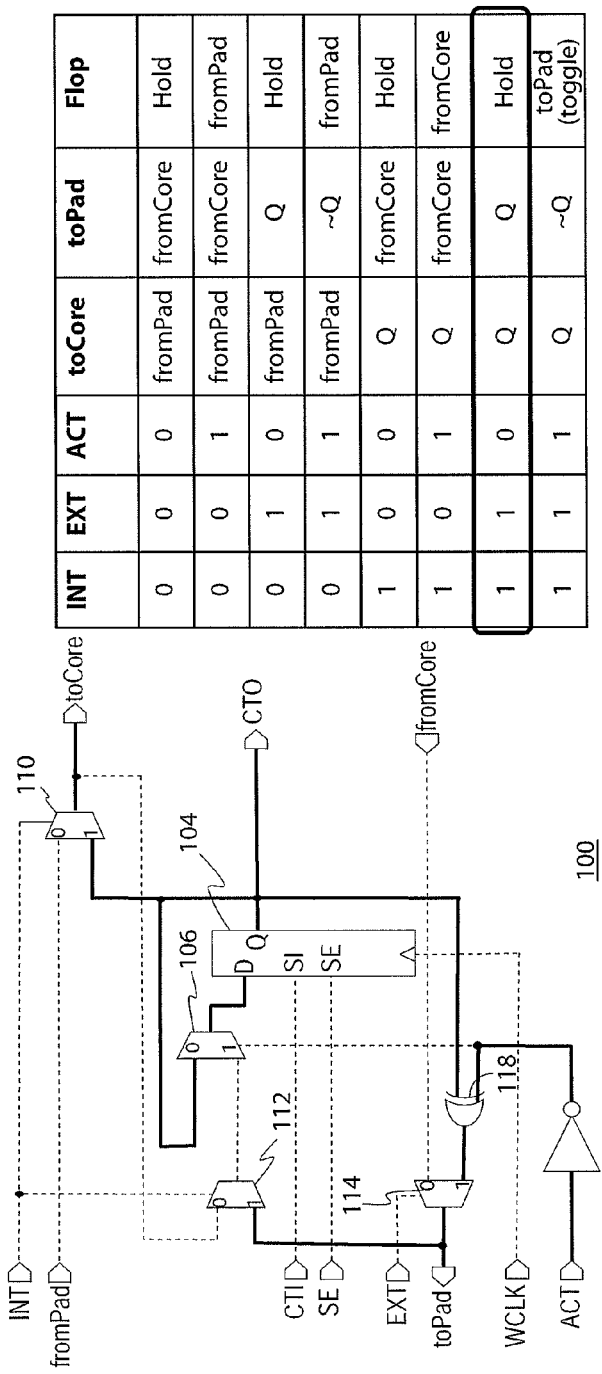
FIG. 19 illustrates the test circuitry of FIG. 12 in an Burn-in (for hold) test mode in accordance with the embodiments.

Referring to FIG. 19, a Burn-in Mode Hold or constant activity mode has test control inputs of INT=1, EXT=1, and ACT=0. The active signal lines in the circuit 100 are highlighted or in bold and also reflected in the function chart 190. The signal "To Core" comes from the Q output of the scannable data storage element or flip flop 104. The signal to the pad also comes from the Q output of the scannable data storage element or flip flop 104. The signaling to and from the multiplexer 106 of the hold data module and the flip flop 104 is similar to the hold pattern of FIG. 13 where output of the flip flop 104 is fed back to the hold data module or multiplexer 106.

Figure 20:
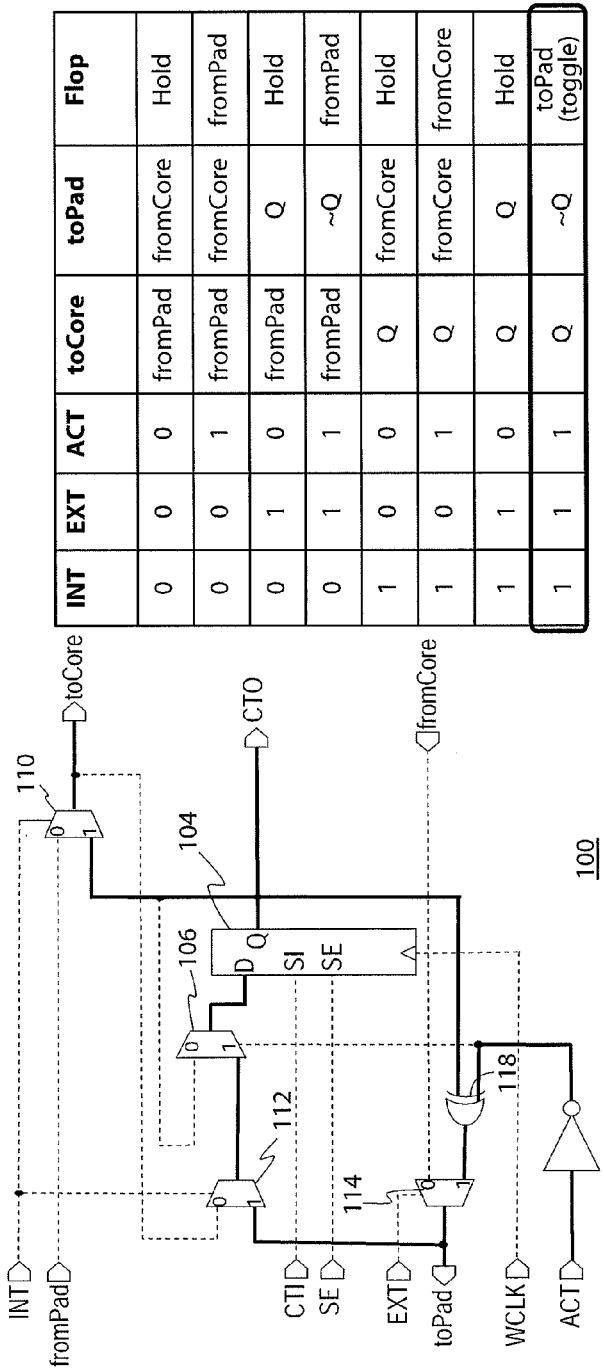
FIG. 20 illustrates the test circuitry of FIG. 12 in an Burn-in test mode (for maximum activity) in accordance with the embodiments.

Referring to FIG. 20, a Burn-in Mode with maximum activity with the pad toggling includes test control inputs of INT=1, EXT=1, and ACT=1. The active signal lines in the circuit 100 are highlighted or in bold and also reflected in the function chart 200. The signal "To Core" comes from the Q output of the scannable data storage element or flip flop 104. The signal to the pad also comes from the Q output of the scannable data storage element or flip flop 104, but the Q output in this instance is toggling. The signaling to the flip flop 104 (via the multiplexers 114 and 112 of the selection logic and via multiplexer 106) of the hold data module is the same toggling signal sent to the pad from the flip flop.

Figure 21:
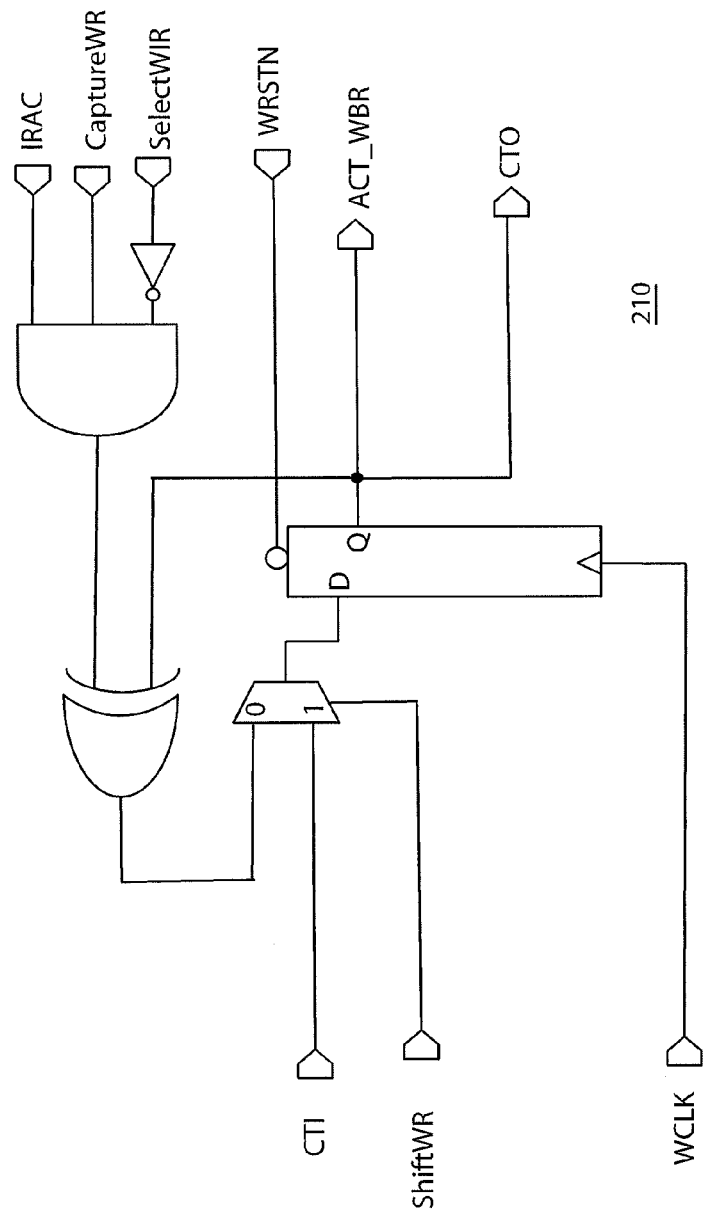
FIG. 21 illustrates an additional control cell design for controlling generation of a waveform used in an AC test in accordance with the embodiments.
Figure 22:
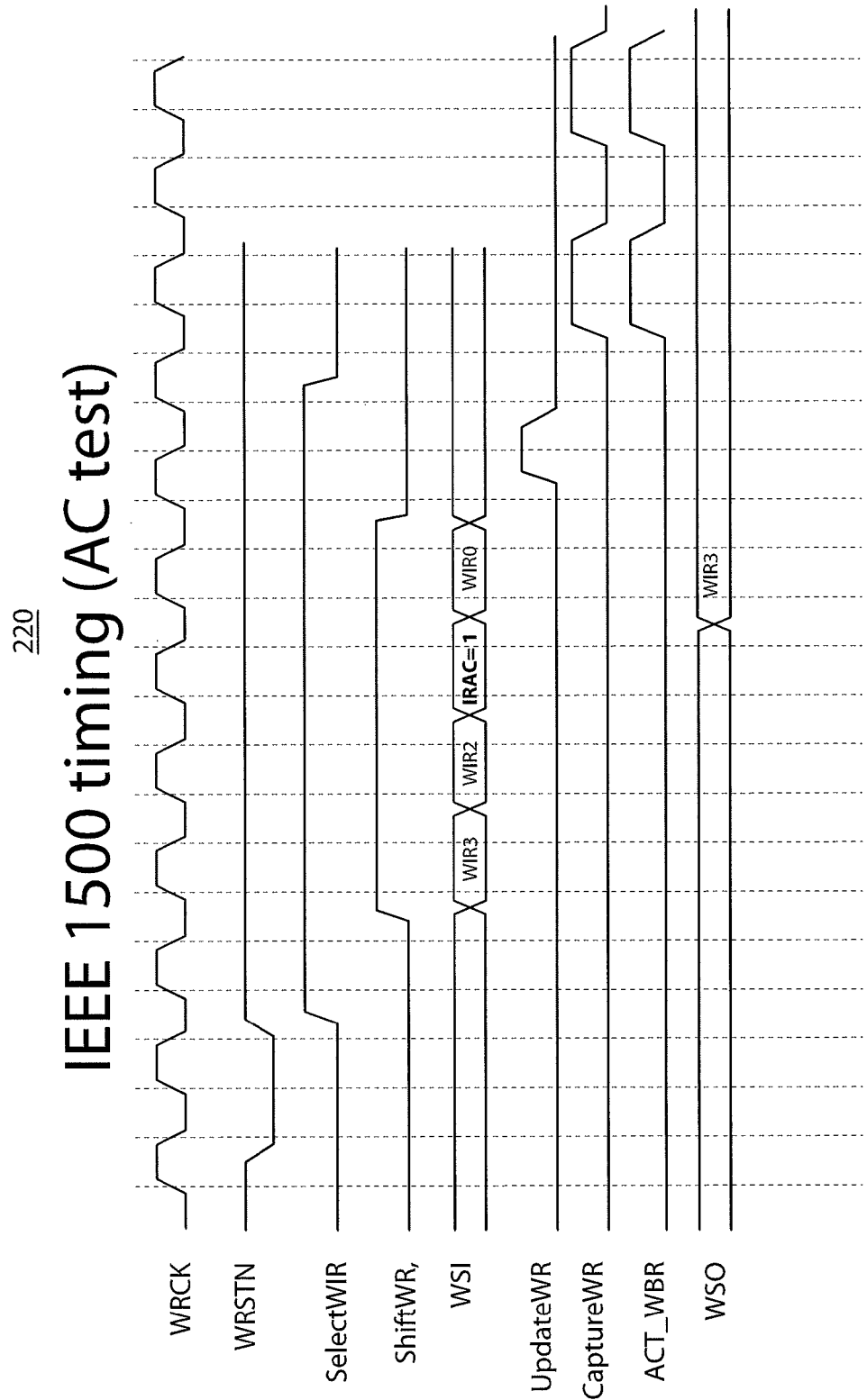
FIG. 22 illustrates a waveform used in an AC test in accordance with the embodiments.

Referring to FIG. 21, an alternative or additional control cell design 210 can be added to control the generation of the ACT_WBR waveform as further illustrated in IEEE 1500 AC test timing chart 220 of FIG. 22. Firstly note that IRAC is a signal generated from the IEEE 1500 instruction register (WIR). When set to 1 it will enable the AC test action. Secondly, an additional bit added to the wrapper does not have any corresponding Die pin or 10 (in FIG. 21). The purpose of this cell is to generate the ACT_WBR waveform.

In one embodiment with reference to FIG. 21 again, the AC test can be implemented by the following protocol:

```
Apply WRSTN
SelectWIR=1        □ Select WIR to shift instructions
ShiftWR=1          □ Shift the instruction to prepare for the test
For sending-end chip set EXT=1, IRAC=1, INT=0 (Outward Facing)
For receiving-end chip set EXT=0, IRAC=0, INT=0 (Normal Mode)
ShiftWR = 0, UpdateWR= 1       □ Apply instruction
SelectWIR = 0      □ Select WBR
ShiftWR            □ Shift Test Pattern (set ACT_WBR to 0 or 1)
CaptureWR  □ Capture test results
CaptureWR  □ Capture test results
ShiftWR            □ Shift test results
Repeat the steps above for each die interconnect.
```

In another aspect, the Burn-in test can be implemented by the following protocol:

```
Apply WRSTN
SelectWIR=1        □ Select WIR to shift instructions
ShiftWR=1          □ Shift the instruction to prepare for the test
For sending end chip set EXT=1, IRAC=1, INT=1 (Burn-in Mode)
For receiving end chip set EXT=1, IRAC=1, INT=1 (Burn-in Mode)
ShiftWR = 0, UpdateWR= 1       □ Apply instruction
SelectWIR = 0      □ Select WBR
ShiftWR            □ Shift Test Pattern (set ACT_WBR to 0)
CaptureWR  □ Capture test results
ShiftWR            □ Shift test results
Repeat the steps above for each die interconnect.
```

In another aspect of the tests above, the ACT_WBR or ACT signal can be generated from the top-level chip or die pin. Thus, such tests and configurations reduce the dependence on an IEEE 1500 controller. However, such configuration as shown in FIG. 21 leads to extra pins. Similarly, other alternate implementation or generation of the ACT or ACT_WBR signal is possible.

In an embodiment, a test circuitry for testing an interconnection between interconnected dies includes a cell embedded within one of the interconnected dies. The cell includes a selection logic module that includes a first multiplexer configured to receive a first control signal and provide a first output test signal; and a second multiplexer configured to receive a second control signal and provide a second output test signal. The cell further includes a scannable data storage module coupled to the first multiplexer; and a transition generation module configured to receive a third control signal; wherein the first and second output test signals are generated based on respective states of the first, second, and third control signals, and wherein the test circuitry is configured to use the first and second output test signals to perform at least two of: a DC test on the interconnection in a first mode, an AC test on the interconnection in a second mode, and a burn-in-test on the interconnection in a third mode.

In another embodiment, a test circuitry for testing an interconnection between interconnected dies includes a cell embedded within one of the interconnected dies. The cell includes a selection logic module that includes a first multiplexer configured to receive a first control signal and provide a first output test signal; and a second multiplexer configured to receive a second control signal and provide a second output test signal. The cell further includes a flip flop coupled to the first multiplexer; a transition generation module configured to receive a third control signal; a third multiplexer coupled between the first multiplexer and the flip flop, and configured to receive the third control signal through the transition generation module; wherein the first and second output test signals are generated based on respective states of the first, second, and third control signals, and wherein the test circuitry is configured to use the first and second output test signals to perform at least two of: a DC test on the interconnection in a first mode, an AC test on the interconnection in a second mode, and a burn-in-test on the interconnection in a third mode.

Yet in another embodiment, a structure including at least a first die and a second die electrically connected to one another using at least an inter-die interconnect. At least one of the first die or the second die includes a test circuitry coupled between a core electrical circuit and a pad of the first or second die, the pad coupled to the inter-die interconnect. The test circuitry includes a cell embedded within the first or second die. The cell further includes: an input port for receiving an input signal from the core electrical circuit of the first or second die, a selection logic module that comprises a first multiplexer configured to receive a first control signal and provide a first output test signal; and a second multiplexer configured to receive a second control signal and provide a second output test signal, a flip flop coupled to the first multiplexer, a transition generation module configured to receive a third control signal, a third multiplexer coupled between the first multiplexer and the flip flop, and configured to receive the third control signal through the transition generation module. The first and second output test signals are generated based on respective states of the first, second, and third control signals, and wherein the test circuitry is configured to use the first output test signal to perform an internal test on the core electrical circuit of the first or second die.

The preceding merely illustrates the principles of the disclosure. It will thus be appreciated that those skilled in the art will be able to devise various arrangements which, although not explicitly described or shown herein, embody the principles of the disclosure and are included within its spirit and scope. Embodiments can include, but is not limited to any test integrated solution that provides support of any combination of AC, DC and Burn-in tests. Such embodiments provide a cost-effective and easy method, apparatus and system to implement such tests including a burn-in test solution. Such embodiments can also be implemented without any extra circuitry compared to what is used for separate DC and AC tests. Furthermore, such embodiment can also avoid or obviate the need to connect functional pins to a tester. Embodiments can further include, but are not limited to wrapper cells or wrapper cell configurations since cells in a more general sense performing the functions described herein are considered within the scope of the claims.

Furthermore, all examples and conditional language recited herein are principally intended expressly to be only for pedagogical purposes and to aid in understanding the principles of the disclosure and the concepts contributed by the inventors to furthering the art, and are to be construed as being without limitation to such specifically recited examples and conditions. Moreover, all statements herein reciting principles, aspects, and embodiments, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "to", "from", "lower," "upper," "horizontal," "vertical," "above," "below," "up," "down," "before", "after", "top" and "bottom" as well as derivatives thereof (e.g., "horizontally," "downwardly," "upwardly," etc.) should be construed to refer to the orientation as then described or as shown in the drawing under discussion. The drawings are arbitrarily oriented for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Although the disclosure has been described in terms of exemplary embodiments, it is not limited thereto. Rather, the appended claims should be construed broadly, to include other variants and embodiments, which can be made by those skilled in the art without departing from the scope and range of equivalents.

What is claimed is:

1. A test circuitry for testing an interconnection between interconnected dies, comprising:
   a cell embedded within one of the interconnected dies, the cell comprising:
   a selection logic module, comprising:
   a first multiplexer configured to receive a first control signal and provide a first output test signal; and
   a second multiplexer configured to receive a second control signal and provide a second output test signal;
   a scannable data storage module coupled to the first multiplexer; and
   a transition generation module configured to receive a third control signal; wherein the first and second output test signals are generated based on a combination of states of the first, second, and third control signals, and wherein the test circuitry is configured to use the first and second output test signals to perform at least two of: a DC test on the interconnection in a first mode, an AC test on the interconnection in a second mode, and a burn-in-test on the interconnection in a third mode.

2. The test circuitry of claim 1, wherein the cell further comprises a third multiplexer coupled between the first multiplexer and the scannable data storage module, and configured to receive the third control signal through the transition generation module.

3. The test circuitry of claim 2, wherein the transition generation module comprises at least an exclusive-or gate and an inverter.

4. The test circuitry of claim 3, wherein the scannable data storage element comprises a flip flop.

5. The test circuitry of claim 4, wherein when the first control signal is in a low state, the second control signal is in a high state, and the third control signal is in the low state, the test circuitry is in the first mode such that the first multiplexer receives a first input test signal and provides the first output test signal based on the first input test signal, the flip flop feeds back a hold output signal from an output to an input of the flip flop through the third multiplexer and provides the hold output signal to the second multiplexer, and the second multiplexer provides the second output test signal using the hold output signal.

6. The test circuitry of claim 4, wherein when the first control signal is in a low state, the second control signal is in a high state, and the third control signal is in the high state, the test circuitry is in the second mode such that the first multiplexer receives a first input test signal and provides the first output test signal based on the first input test signal, the flip flop receives the first output test signal through the third multiplexer and provides an inversion of a hold output signal at an output of the flip flop to the second multiplexer, and the second multiplexer provides the second output test signal using the inversion of the hold output signal.

7. The test circuitry of claim 4, wherein when the first control signal is in a high state, the second control signal is in the high state, and the third control signal is in a low state, the test circuitry is in the third mode such that the first multiplexer receives a hold output signal from an output of the flip flop and provides the first output test signal using the hold output signal, the flip flop feeds back the hold output signal from the output to an input of the flip flop through the third multiplexer and provides the hold output signal to the second multiplexer, and the second multiplexer provides the second output test signal using the hold output signal.

8. The test circuitry of claim 4, wherein when the first control signal is in a high state, the second control signal is in the high state, and the third control signal is the high state, the test circuitry is in the third mode such that the first multiplexer receives a hold output signal from an output of the flip flop and provides the first output test signal using the hold output signal, the flip flop provides an inversion of the hold output signal to the second multiplexer, and the second multiplexer provides the second output test signal using the inversion of the hold output signal.

9. The test circuitry of claim 1, wherein the interconnected dies are three dimensional stacked die having integrated circuits thereon.

10. The test circuitry of claim 1, wherein the cell is arranged and constructed between an integrated circuit core of the one of the interconnected dies and a bi-directionally connected pad of the one of the interconnected dies for testing of the integrated circuit core.

11. A test circuitry for testing an interconnection between interconnected dies, comprising:
    a cell embedded within one of the interconnected dies, the cell comprising:
    a selection logic module, comprising:
    a first multiplexer configured to receive a first control signal and provide a first output test signal; and
    a second multiplexer configured to receive a second control signal and provide a second output test signal;
    a flip flop coupled to the first multiplexer;
    a transition generation module configured to receive a third control signal;
    a third multiplexer coupled between the first multiplexer and the flip flop, and configured to receive the third control signal through the transition generation module;
    wherein the first and second output test signals are generated based on a combination of states of the first, second, and third control signals, and wherein the test circuitry is configured to use the first and second output test signals to perform at least one of: a DC test on the interconnection in a first mode, an AC test on the interconnection in a second mode, and a burn-in-test on the interconnection in a third mode.

12. The test circuitry of claim 11, wherein the transition generation module comprises at least an exclusive-or gate and an inverter.

13. The test circuitry of claim 11, wherein when the first control signal is in a low state, the second control signal is in a high state, and the third control signal is in the low state, the test circuitry is in the first mode such that the first multiplexer receives a first input test signal and provides the first output test signal based on the first input test signal, the flip flop feeds back a hold output signal from an output to an input of the flip flop through the third multiplexer and provides the hold output signal to the second multiplexer, and the second multiplexer provides the second output test signal using the hold output signal.

14. The test circuitry of claim 11, wherein when the first control signal is in a low state, the second control signal is in a high state, and the third control signal is in the high state, the test circuitry is in the second mode such that the first multiplexer receives a first input test signal and provides the first output test signal based on the first input test signal, the flip flop receives the first output test signal through the third multiplexer and provides an inversion of a hold output signal at an output of the flip flop to the second multiplexer, and the second multiplexer provides the second output test signal using the inversion of the hold output signal.

15. The test circuitry of claim 11, wherein when the first control signal is in a high state, the second control signal is in the high state, and the third control signal is in a low state, the test circuitry is in the third mode such that the first multiplexer receives a hold output signal from an output of the flip flop and provides the first output test signal using the hold output signal, the flip flop feeds back the hold output signal from the output to an input of the flip flop through the third multiplexer and provides the hold output signal to the second multiplexer, and the second multiplexer provides the second output test signal using the hold output signal.

16. The test circuitry of claim 11, wherein when the first control signal is in a high state, the second control signal is in the high state, and the third control signal is the high state, the test circuitry is in the third mode such that the first multiplexer receives a hold output signal from an output of the flip flop and provides the first output test signal using the hold output signal, the flip flop provides an inversion of the hold output signal to the second multiplexer, and the second multiplexer provides the second output test signal using the inversion of the hold output signal.

17. A structure comprising at least a first die and a second die electrically connected to one another using at least an inter-die interconnect, at least one of the first die or the second die comprising:
a test circuitry coupled between a core electrical circuit and a pad of the first or second die, the pad coupled to the inter-die interconnect and the test circuitry comprising:
a cell embedded within the first or second die, the cell comprising:
an input port for receiving an input signal from the core electrical circuit of the first or second die;
a selection logic module, comprising:
a first multiplexer configured to receive a first control signal and provide a first output test signal; and
a second multiplexer configured to receive a second control signal and provide a second output test signal;
a flip flop coupled to the first multiplexer;
a transition generation module configured to receive a third control signal;
a third multiplexer coupled between the first multiplexer and the flip flop, and configured to receive the third control signal through the transition generation module;
wherein the first and second output test signals are generated based on a combination of states of the first, second, and third control signals, and wherein the test circuitry is configured to use the first output test signal to perform an internal test on the core electrical circuit of the first or second die.

18. The structure of claim 17, wherein when the first control signal is in a high state, the second control signal is in a low state, and the third control signal is in the low state, the test circuitry is performing the internal test such that the flip flop feeds back a hold output signal from an output to an input of the flip flop through the third multiplexer and provides the hold output signal to the first multiplexer as the first output test signal, and the second multiplexer receives the input signal from the core electrical circuit of the first or second die and uses the input signal as the second output test signal.

19. The structure of claim 17, wherein when the first control signal is in a high state, the second control signal is in a low state, and the third control signal is in the high state, the test circuitry is performing the internal test such that the second multiplexer receives the input signal from the core electrical circuit of the first or second die, uses the input signal as the second output test signal, the flip flop receives the second output test signal from the second multiplexer through the third multiplexer and provides a hold output signal to the first multiplexer based on the second output test signal, and the first multiplexer provides the first output test signal using the hold output signal.

20. The structure of claim 17, wherein the transition generation module comprises at least an exclusive-or gate and an inverter.

* * * * *